US012646566B2

(12) United States Patent
Choi et al.

(10) Patent No.: US 12,646,566 B2
(45) Date of Patent: Jun. 2, 2026

(54) PAGE BUFFER, SEMICONDUCTOR DEVICE INCLUDING THE PAGE BUFFER, AND OPERATING METHOD OF THE SEMICONDUCTOR DEVICE

(71) Applicant: SK hynix Inc., Icheon-si (KR)

(72) Inventors: Won Jae Choi, Icheon-si (KR); Won Jun Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 149 days.

(21) Appl. No.: 18/485,040

(22) Filed: Oct. 11, 2023

(65) Prior Publication Data

US 2024/0420768 A1     Dec. 19, 2024

(30) Foreign Application Priority Data

Jun. 19, 2023     (KR) ........................ 10-2023-0077987

(51) Int. Cl.
G11C 16/00          (2006.01)
G11C 16/04          (2006.01)
G11C 16/08          (2006.01)
G11C 16/10          (2006.01)

(52) U.S. Cl.
CPC .......... G11C 16/10 (2013.01); G11C 16/0483 (2013.01); G11C 16/08 (2013.01)

(58) Field of Classification Search
CPC ..... G11C 16/10; G11C 16/0483; G11C 16/08; G11C 11/5628; G11C 16/24; G11C 16/26; G11C 16/32; G11C 16/3418; G11C 16/3459; G11C 7/04
See application file for complete search history.

(56) References Cited

U.S. PATENT DOCUMENTS

| | | | | |
|---|---|---|---|---|
| 5,039,879 A | * | 8/1991 | Parrish ................. | G11C 27/024 |
| | | | | 327/306 |
| 7,471,580 B2 | | 12/2008 | Henzler et al. | |
| 7,495,492 B2 | | 2/2009 | Nsame et al. | |
| 2013/0336058 A1 | * | 12/2013 | Joo ........................ | G11C 16/26 |
| | | | | 365/185.08 |
| 2022/0044730 A1 | * | 2/2022 | Kim ....................... | G11C 16/10 |

FOREIGN PATENT DOCUMENTS

KR          101991335 B1     6/2019

* cited by examiner

*Primary Examiner* — Uyen Smet
(74) *Attorney, Agent, or Firm* — WILLIAM PARK AND ASSOCIATES LTD.

(57)          ABSTRACT

A semiconductor device includes a memory cell connected to a word line and a bit line. The semiconductor device also includes a line driving circuit configured to apply a program voltage to the word line. The semiconductor device further includes a page buffer comprising a plurality of latches comprising at least one dynamic latch and at least one static latch and configured to control a voltage level of the bit line after the start of a program operation. The semiconductor device additionally includes a control circuit configured to control the page buffer to program, into the memory cell, data that have been stored in the static latch or store the data in the dynamic latch based on a temperature of the semiconductor device, when receiving a pause command during the program operation.

9 Claims, 8 Drawing Sheets

S40

START

↓

CHECK TEMPERATURE — S41

↓

TEMPERATURE >
60 DEGREES? — S42

Y → PROGRAM DATA OF STATIC
LATCH IN MEMORY CELL — S43

N
↓

MOVE DATA OF STATIC LATCH
TO DYNAMIC LATCH — S44

↓

TEMPERATURE >
25 DEGREES? — S45

Y → FIRST CYCLE REFRESH OF
DYNAMIC LATCH — S46

N
↓

SECOND CYCLE REFRESH OF
DYNAMIC LATCH — S47

↓

END

PAGE BUFFER, SEMICONDUCTOR DEVICE INCLUDING THE PAGE BUFFER, AND OPERATING METHOD OF THE SEMICONDUCTOR DEVICE

CROSS-REFERENCE TO RELATED APPLICATION

This application claims priority under 35 U.S.C. § 119(a) to Korean Patent Application No. 10-2023-0077987 filed on Jun. 19, 2023, in the Korean Intellectual Property Office, which is incorporated herein by reference in its entirety.

BACKGROUND

1. Technical Field

Embodiments relate to an integrated circuit technology and, more particularly, to a page buffer, a semiconductor device including the page buffer, and an operating method of the semiconductor device.

2. Related Art

As electronic devices are reduced in size, have low power consumption and high performance, and are diversified, a semiconductor device capable of storing information is required for various electronic devices, such as computers and portable communication devices. The semiconductor device may be basically classified as a volatile memory device or a nonvolatile memory device. A volatile memory device has a fast data processing speed, but has a disadvantage in that the volatile memory device needs to be continuously supplied with power to maintain data that has been stored in the volatile memory device. A nonvolatile memory device does not need to be continuously supplied with power to maintain data that has been stored in the nonvolatile memory device, but has a disadvantage in that the nonvolatile memory device has a slow data processing speed.

Research continues on a nonvolatile memory device for increasing data storage capacity by increasing an area efficiency and securing the reliability of a program operation.

SUMMARY

In an embodiment, a semiconductor device may include: a memory cell connected to a word line and a bit line; a line driving circuit configured to apply a program voltage to the word line; a page buffer including a plurality of latches including at least one dynamic latch and at least one static latch and configured to control a voltage level of the bit line after the start of a program operation; and a control circuit configured to control the page buffer to program, into the memory cell, data that have been stored in the static latch or store the data in the dynamic latch based on a temperature of the semiconductor device, when receiving a pause command during the program operation.

In an embodiment, a page buffer may include a switch circuit controlled to connect or disconnect a bit line and a common node in response to a page buffer selection signal. The page buffer may also include at least one static latch and at least one dynamic latch connected to the common node and each configured to store data corresponding to a voltage level of the common node or form the voltage level of the common node as a voltage level corresponding to data that have been stored in the static latch and the dynamic latch in response to a latch control signal. The data that have been stored in the static latch are programmed into a memory cell or moved to the dynamic latch through the bit line based on a temperature of a semiconductor device.

In an embodiment, an operating method of a semiconductor device may include: determining whether a program operation has been completed; checking whether a pause command is received in a state in which the program operation has not been completed; controlling a page buffer so that data that have been stored in latches of the page buffer are moved, when receiving the pause command; and controlling the page buffer so that the moved data are returned when receiving a resumption command.

DETAILED DESCRIPTION

Hereinafter, embodiments according to the technical spirit of the present disclosure are described with reference to the accompanying drawings.

Some embodiments of the present disclosure are directed to a semiconductor device capable of performing a program pause operation by using a page buffer including a dynamic latch, and an operating method of the semiconductor device.

An area efficiency can be improved, and the reliability of a program operation can also be improved.

Figure 1:
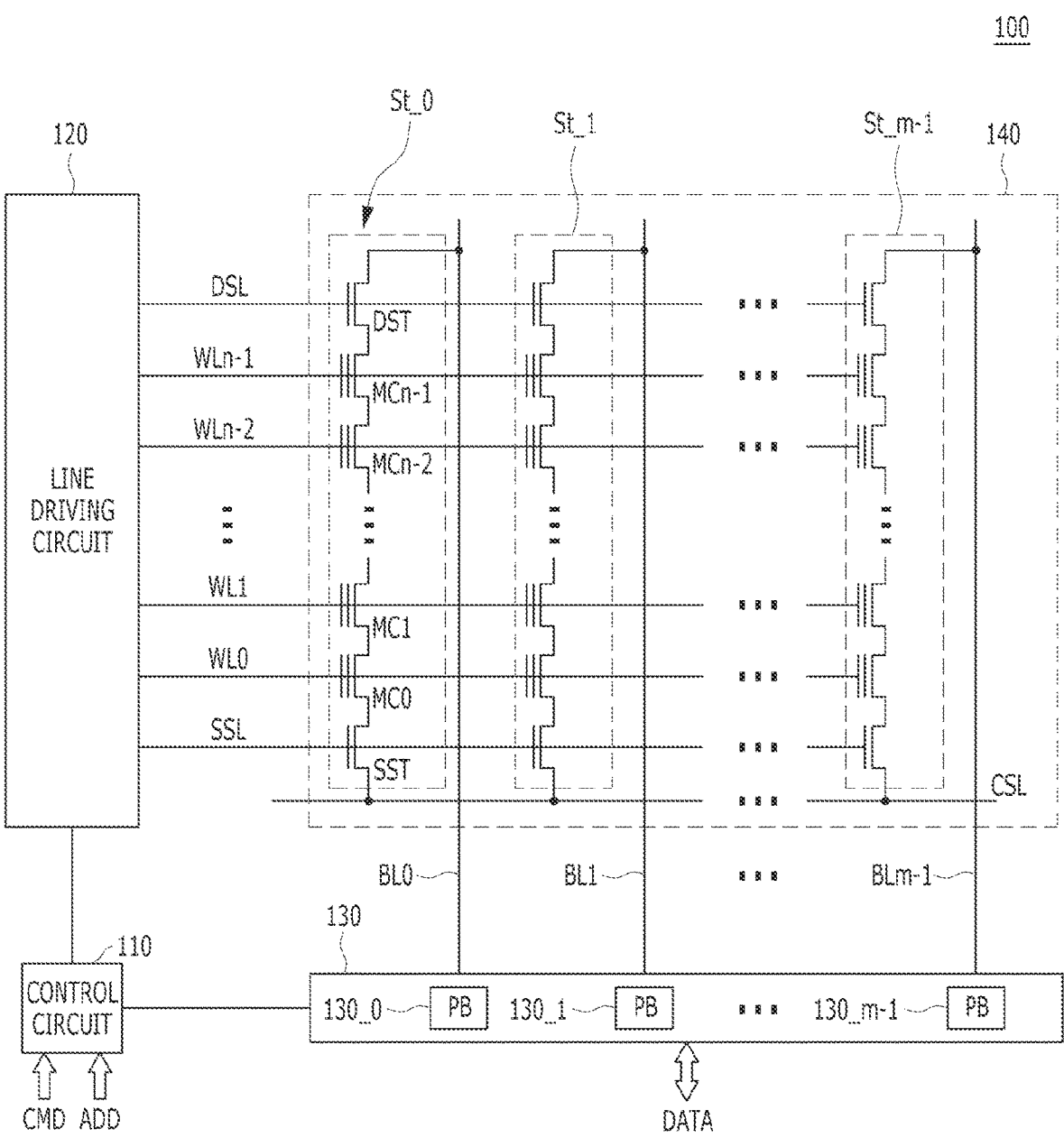
FIG. 1 is a diagram illustrating a construction of a semiconductor device according to an embodiment of the present disclosure.

FIG. 1 is a diagram illustrating a construction of a semiconductor device according to an embodiment of the present disclosure.

Referring to FIG. 1, a semiconductor device 100 according to an embodiment of the present disclosure may include a control circuit 110, a line driving circuit 120, a page buffer group 130, and a cell string group 140.

The control circuit 110 may program data into the cell string group 140 or erase data programmed into the cell string group 140 by controlling the line driving circuit 120, the page buffer group 130, and the cell string group 140.

The line driving circuit 120 may drive a drain selection line DSL, word lines WL0 to WLn-1, and a source selection line SSL to internal voltage levels, respectively, under the control of the control circuit 110. After the start of a program operation, the line driving circuit 120 may apply a program voltage to at least one of the word lines WL0 to WLn-1 as an internal voltage under the control of the control circuit 110.

The page buffer group 130 may include a plurality of page buffers PB (130_0 to 130_m-1). The plurality of page buffers 130_0 to 130_m-1 may be connected to a plurality of bit lines BL0 to BLm-1, respectively, under the control of the control circuit 110. When the plurality of page buffers 130_0 to 130_m-1 is connected to the bit lines BL0 to BLm-1, respectively, under the control of the control circuit 110, the plurality of page buffers 130_0 to 130_m-1 may apply, to the bit lines BL0 to BLm-1, voltage levels corresponding to data that have been stored in the plurality of page buffers 130_0 to 130_m-1, respectively. Furthermore, each of the plurality of page buffers 130_0 to 130_m-1 may sense data programmed into a memory cell through each of the bit lines BL0 to BLm-1 that have been connected to the plurality of page buffers 130_0 to 130_m-1, under the control of the control circuit 110.

The cell string group 140 may include a plurality of cell strings St_0 to St_m-1. The plurality of cell strings St_0 to St_m-1 may be connected between the respective bit lines BL0 to BLm-1 and the source line CSL. Each of the plurality of cell strings St_0 to St_m-1 may include a drain selection transistor DST, a plurality of cell transistors MC0 to MCn-1, and a source selection transistor SST. In this case, the components of the plurality of cell strings St_0 to St_m-1 are the same except that the names of signals input to the components or lines connected to the components are different. Accordingly, the components of the cell string St_0, among the plurality of cell strings St_0 to St_m-1, may be described as a representative.

The cell string St_0 may include the drain selection transistor DST, the plurality of cell transistors MC0 to MCn-1, and the source selection transistor SST that are connected in series between the bit line BL0 and a source line CSL.

The drain selection transistor DST may include a gate to which the drain selection line DSL is connected and a drain and a source to which the bit line BL0 and the cell transistor MCn-1 are connected, respectively.

The plurality of cell transistors MC0 to MCn-1 may be connected between the drain selection transistor DST and the source selection transistor SST in series. The plurality of word lines WL0 to WLn-1 may be connected to the gates of the plurality of cell transistors MC0 to MCn-1, respectively. In this case, each of the plurality of cell transistors MC0 to MCn-1 may perform a role as a memory cell for storing data. Hereinafter, each of the plurality of cell transistors MC0 to MCn-1 may be named a memory cell.

The source selection transistor SST may include a gate to which the source selection line SSL is connected and a drain and a source to which the cell transistor MC0 and the source line CSL are connected, respectively.

The semiconductor device 100 constructed as described above according to an embodiment of the present disclosure may program some of data that have been stored in a page buffer into a memory cell or periodically refresh the page buffer based on a temperature of the semiconductor device 100, when receiving a pause command during a program operation. Thereafter, when receiving a program resumption command, the semiconductor device 100 may return, to the page buffer, the data programmed into the memory cell when receiving the pause command or terminate a refresh operation, and may subsequently perform a program operation that has been suspended.

Figure 2:
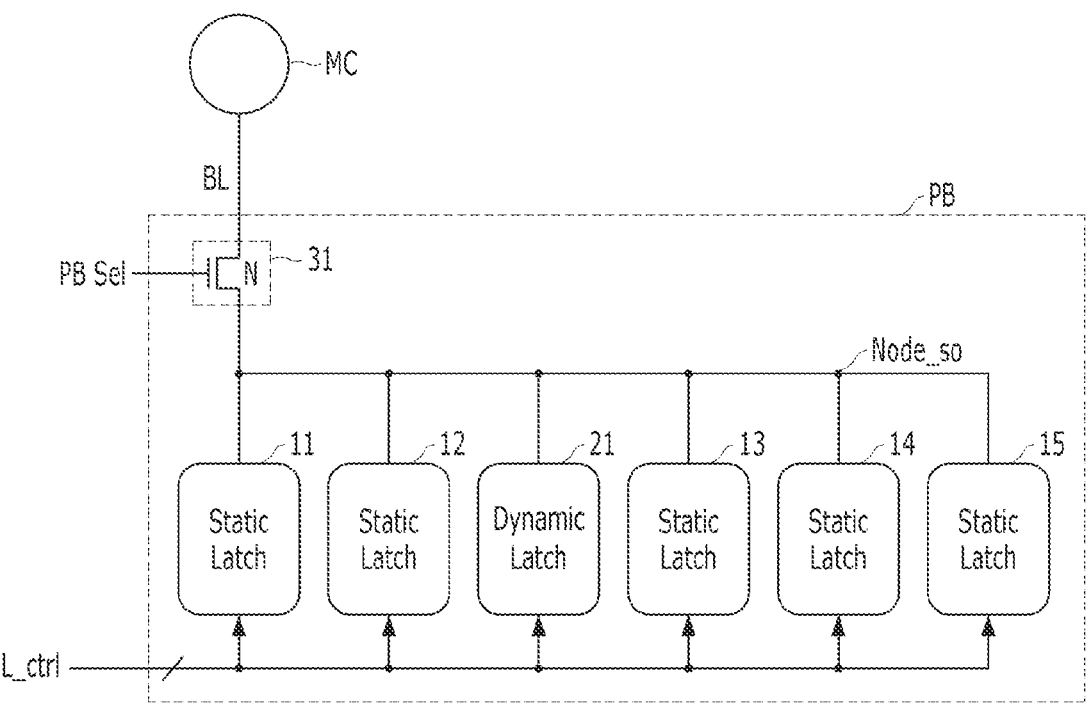
FIG. 2 is a diagram illustrating a construction of a page buffer that is included in a semiconductor device according to an embodiment of the present disclosure.

FIG. 2 is a diagram illustrating a construction of a page buffer that is included in the semiconductor device according to an embodiment of the present disclosure. The plurality of page buffers 130_0 to 130_m-1 illustrated in FIG. 1 may have the same internal components except that the names of signals input to the components or lines connected to the components are different. Accordingly, a description of the components of each of the plurality of page buffers 130_0 to 130_m-1 may be substituted with the components of the page buffer PB illustrated in FIG. 2.

Referring to FIG. 2, the page buffer PB may include a plurality of latches 11, 12, 13, 14, 15, and 21 and a switch circuit 31.

The plurality of latches 11, 12, 13, 14, 15, and 21 may be connected to a common node Node_so in common. Each of the plurality of latches 11, 12, 13, 14, 15, and 21 may form the voltage level of the common node Node_so as a voltage level corresponding to data that have been stored in each latch or store data corresponding to the voltage level of the common node Node_so, in response to the latch control signal L_ctrl provided by the control circuit 110. That is, each of the plurality of latches 11, 12, 13, 14, 15, and 21 may output, to the common node Node_so, data that have been stored in each latch or may receive and store the data of the common node Node_so, in response to the latch control signal L_ctrl. In this case, at least one latch (e.g., the latch 21), among the plurality of latches 11, 12, 13, 14, 15, and 21, may be a dynamic latch, and the remaining latches may be static latches. The dynamic latch may have a number of transistors less than a number of transistors that are included in a static latch, and may require a refresh operation to maintain data that have been stored in the dynamic latch. The page buffer PB may include at least one dynamic latch to improve an area efficiency of the page buffer PB, and may perform a refresh operation to maintain data that have been stored in the dynamic latch. In an embodiment of the present disclosure, the semiconductor device including the page buffer having one dynamic latch is merely described, but the present disclosure is not limited to such an example.

The plurality of latches 11, 12, 13, 14, 15, and 21 may include first to fifth static latches 11, 12, 13, 14, and 15 and a dynamic latch 21. The first static latch 11 at a location closest to the bit line BL may perform an operation of applying, to the bit line BL, a voltage corresponding to data that have been stored in the first static latch 11 or sensing the voltage level of the bit line BL, in addition to an operation of storing data in response to the latch control signal L_ctrl.

Furthermore, the fifth static latch 15 at a location farthest from the bit line BL may perform an operation of storing data transmitted from the outside of the page buffer PB and transmitting the stored data to other latches 11, 12, 13, 14, and 21 or receiving data that have been stored in other latches 11, 12, 13, 14, and 21 and outputting the received data to the outside of the page buffer PB.

The switch circuit 31 may electrically connect or disconnect the bit line BL and the common node Node_so in response to a page buffer selection signal PB Sel that is provided by the control circuit 110. For example, when the page buffer selection signal PB Sel is enabled, the switch circuit 31 may electrically connect the bit line BL and the common node Node_so. Furthermore, when the page buffer selection signal PB Sel is disabled, the switch circuit 31 may electrically separate the bit line BL and the common node Node_so.

The switch circuit 31 may include a transistor N having a gate to which the page buffer selection signal PB Sel is input and a drain and a source to which the bit line BL and the common node Node_so are connected, respectively.

FIGS. 3 to 6 are diagrams for describing an operation of the page buffer that is included in the semiconductor device according to an embodiment of the present disclosure.

Figure 3:
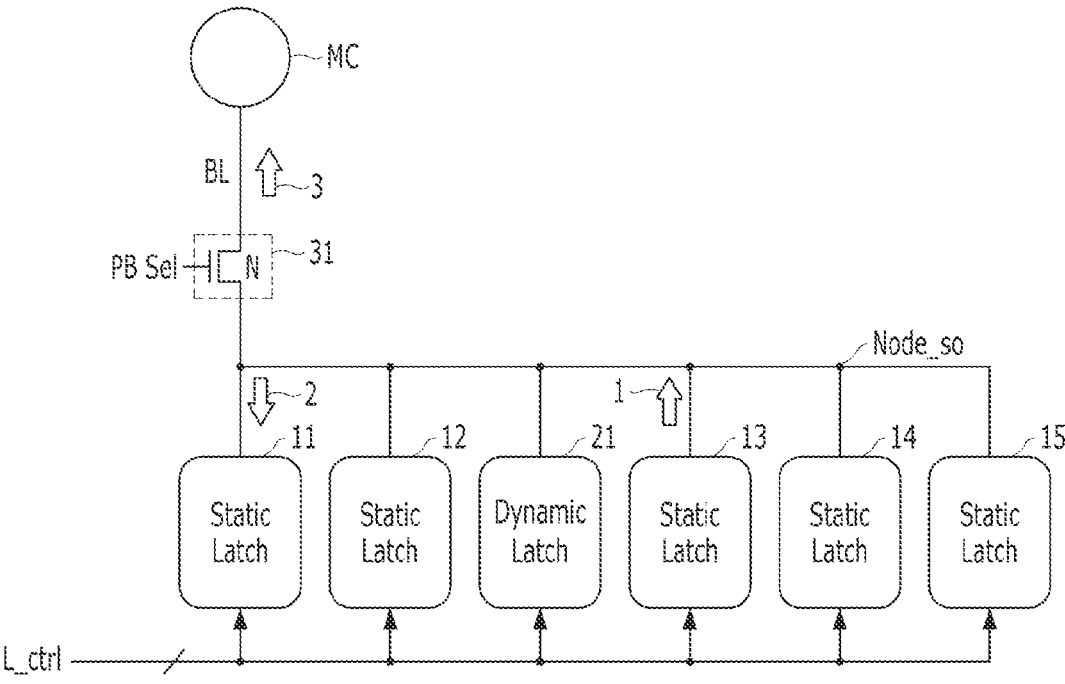
FIGS. 3 to 6 are diagrams for describing an operation of a page buffer that is included in a semiconductor device according to an embodiment of the present disclosure.

FIG. 3 is a diagram for describing data movement and program operations between static latches that are included in the page buffer PB. FIG. 3 merely illustrates an operation of storing, in the first static latch 11, data that have been stored in the third static latch 13 as an example to describe the data movement between the static latches, but the present disclosure is not limited to the example.

Referring to FIG. 3, the third static latch 13 may form the voltage level of the common node Node_so as a voltage level corresponding to data that have been stored in the third static latch 13, in response to the latch control signal L_ctrl. That is, as indicated in the direction of a first arrow 1, the third static latch 13 may transmit, to the common node Node_so, data that have been stored in the third static latch 13. The first static latch 11 may store the data corresponding to the voltage level of the common node Node_so, in response to the latch control signal L_ctrl. That is, as indicated in the direction of a second arrow 2, the first static latch 11 may receive and store the data of the third static latch 13, which are transmitted through the common node Node_so. Thereafter, when the switch circuit 31 connects the bit line BL and the common node Node_so in response to the page buffer selection signal PB Sel, the first static latch 11 may provide the bit line BL with a voltage corresponding to the data that have been stored in the first static latch 11 via the common node Node_so and the switch circuit 31, in response to the latch control signal L_ctrl. That is, as indicated in the direction of a third arrow 3, the first static latch 11 may provide the bit line BL with the voltage corresponding to the stored data. In this case, the voltage provided by the first static latch 11 may be transmitted to the memory cell MC through the bit line BL. Data corresponding to the voltage level of the bit line BL may be programmed into the memory cell MC.

Figure 4:
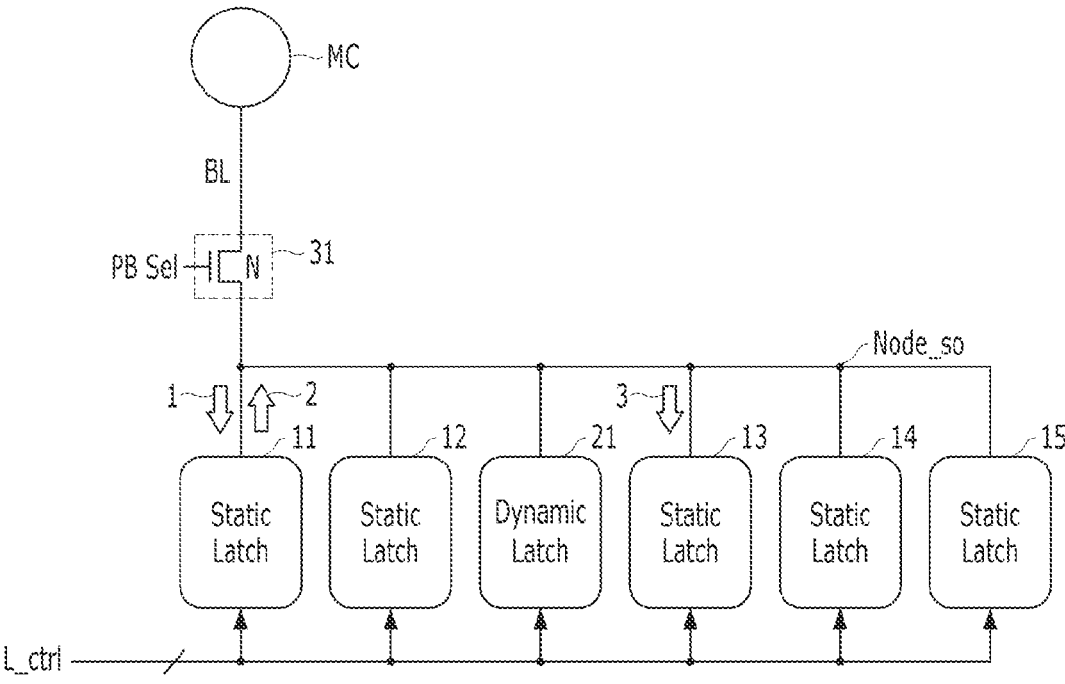

FIG. 4 is a diagram for describing data movement and read operations between static latches that are included in the page buffer PB. FIG. 4 merely illustrates an operation of storing, in the third static latch 13, data that have been stored in the first static latch 11 as an example to describe the data movement between the static latches, but the present disclosure is not limited to the example.

Referring to FIG. 4, the switch circuit 31 may connect the bit line BL and the common node Node_so in response to the page buffer selection signal PB Sel. When the bit line BL and the common node Node_so are connected by the switch circuit 31, the first static latch 11 may sense and store data that have been programmed into the memory cell MC, in response to the latch control signal L_ctrl. That is, as indicated in the direction of a first arrow 1, the data that have been programmed into the memory cell MC may be sensed and stored in the first static latch 11. Thereafter, the switch circuit 31 may separate the bit line BL and the common node Node_so in response to the page buffer selection signal PB Sel. The first static latch 11 may form the voltage level of the common node Node_so as a voltage level corresponding to the data that have been stored in the first static latch 11, in response to the latch control signal L_ctrl. That is, as indicated in the direction of a second arrow 2, the first static latch 11 may transmit, to the common node Node_so, the data that have been stored in the first static latch 11. The third static latch 13 may store the data corresponding to the voltage level of the common node Node_so, in response to the latch control signal L_ctrl. That is, as indicated in the direction of a third arrow 3, the third static latch 13 may receive and store the data of the first static latch 11, which are transmitted through the common node Node_so. As in the data movement operation between the first and third static latches 11 and 13, after the start of a read operation, the data of the third static latch 13 may be moved to the fifth static latch 15. The fifth static latch 15 may output, to the outside of the page buffer PB, the data that have been stored in the fifth static latch 15.

Figure 5:
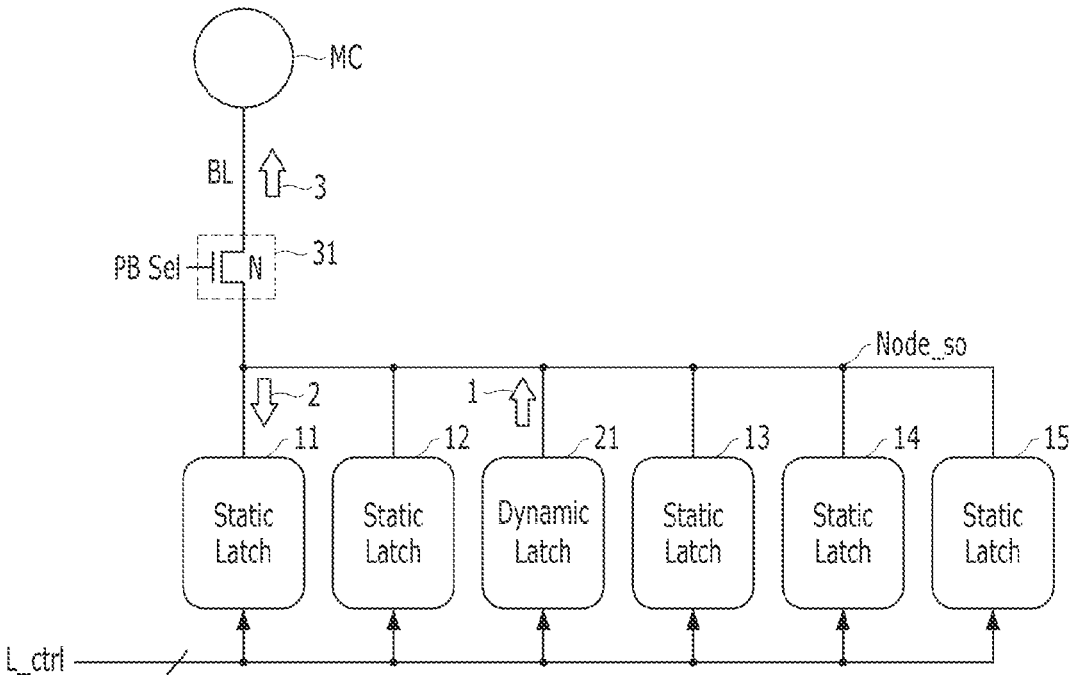

FIG. 5 is a diagram for describing data movement and program operations between a static latch and a dynamic latch that are included in the page buffer PB. FIG. 5 merely illustrates an operation of storing, in the first static latch 11, data stored in the dynamic latch 21 as an example to describe the data movement between the static latch and the dynamic latch, but the present disclosure is not limited to the example.

Referring to FIG. 5, the dynamic latch 21 may form the voltage level of the common node Node_so as a voltage level corresponding to data that have been stored in the dynamic latch 21, in response to the latch control signal L_ctrl. That is, as indicated in the direction of a first arrow 1, the dynamic latch 21 may transmit, to the common node Node_so, the data that have been stored in the dynamic latch 21. The first static latch 11 may store the data corresponding to the voltage level of the common node Node_so, in response to the latch control signal L_ctrl. That is, as indicated in the direction of a second arrow 2, the first static latch 11 may receive and store the data of the dynamic latch 21, which are transmitted through the common node Node_so. Thereafter, when the switch circuit 31 connects the bit line BL and the common node Node_so in response to the page buffer selection signal PB Sel, the first static latch 11 may provide the bit line BL with a voltage corresponding to the data that have been stored in the first static latch 11 via the common node Node_so and the switch circuit 31, in response to the latch control signal L_ctrl. That is, as indicated in the direction of a third arrow 3, the first static latch 11 may provide the bit line BL with a voltage corresponding to the stored data. In this case, the voltage provided by the first static latch 11 may be transmitted to the memory cell MC through the bit line BL. The data corresponding to the voltage level of the bit line BL may be programmed into the memory cell MC.

Figure 6:
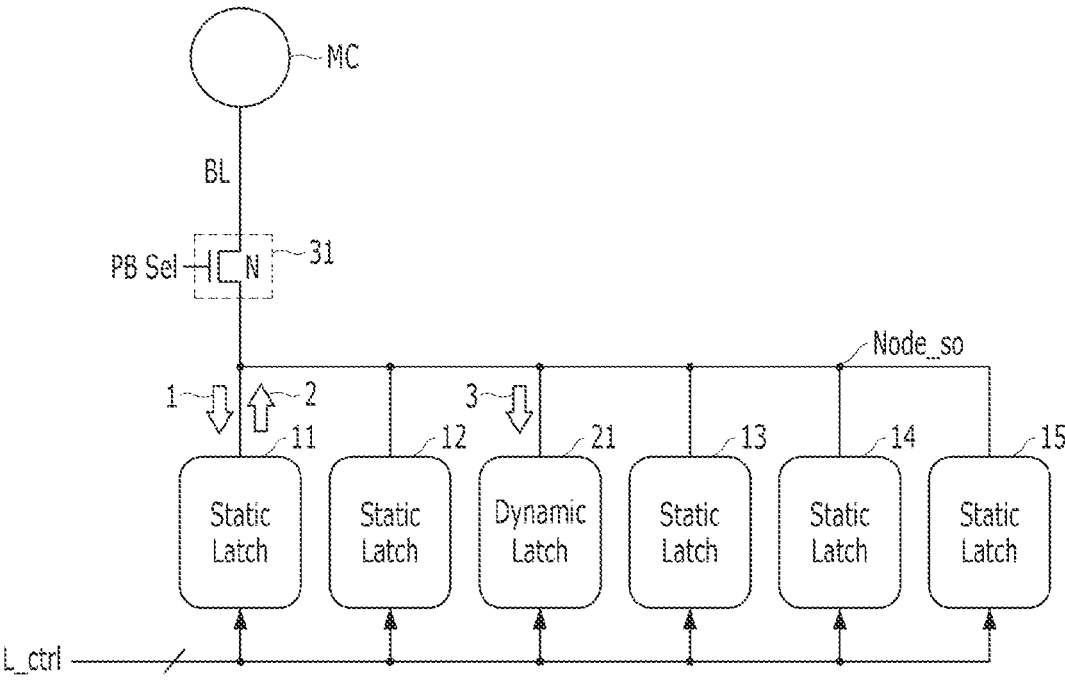

FIG. 6 is a diagram for describing data movement and read operations between a dynamic latch and a static latch that are included in the page buffer PB. FIG. 6 merely illustrates an operation of storing, in the dynamic latch 21, data that have been stored in the first static latch 11 as an example to describe the data movement between the dynamic latch and the static latch, but the present disclosure is not limited to the example.

Referring to FIG. 6, the switch circuit 31 may connect the bit line BL and the common node Node_so in response to the page buffer selection signal PB Sel. When the bit line BL and the common node Node_so are connected by the switch circuit 31, the first static latch 11 may sense and store data that have been programmed into the memory cell MC in response to the latch control signal L_ctrl. That is, as indicated in the direction of a first arrow 1, the data that have been programmed into the memory cell MC may be sensed and stored in the first static latch 11. Thereafter, the switch circuit 31 may separate the bit line BL and the common node Node_so in response to the page buffer selection signal PB Sel. The first static latch 11 may form the voltage level of the common node Node_so as a voltage level corresponding to the stored data in response to the latch control signal L_ctrl. That is, as indicated in the direction of a second arrow 2, the first static latch 11 may transmit the stored data to the common node Node_so. The dynamic latch 21 may store the data corresponding to the voltage level of the common node Node_so, in response to the latch control signal L_ctrl. That is, as indicated in the direction of a third arrow 3, the dynamic latch 21 may receive and store the data of the first static latch 11, which are transmitted through the common node Node_so. Identically with the data movement operation between the first static latch 11 and the dynamic latch 21, after the start of a read operation, the data of the dynamic latch 21 may be moved to the fifth static latch 15. The fifth static latch 15 may output, to the outside of the page buffer PB, the data that have been stored in the fifth static latch 15.

As described above, a data movement between the plurality of latches 11, 12, 13, 14, 15, and 21 that are included in the page buffer PB may be performed through the medium of the common node Node_so regardless of the type (i.e., static or dynamic) of latch. It has been described that a data movement between latches is performed during a program operation and a read operation as an example. However, a data movement between latches through the common node Node_so may be performed even during another operation in addition to the program and read operations.

Figure 7:
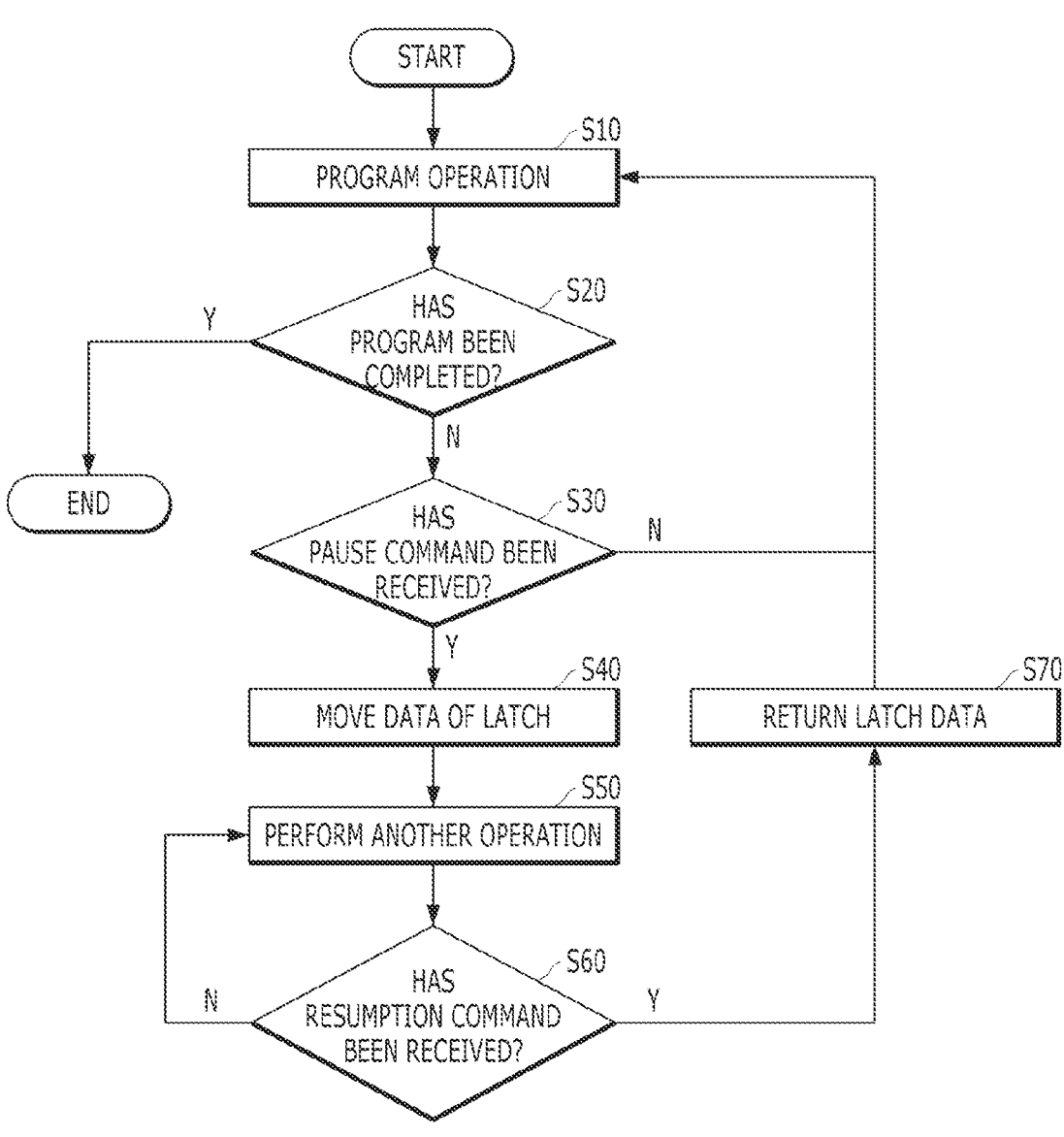
FIGS. 7 and 8 are flowcharts for describing operating methods of a semiconductor device according to embodiments of the present disclosure.
Figure 8:
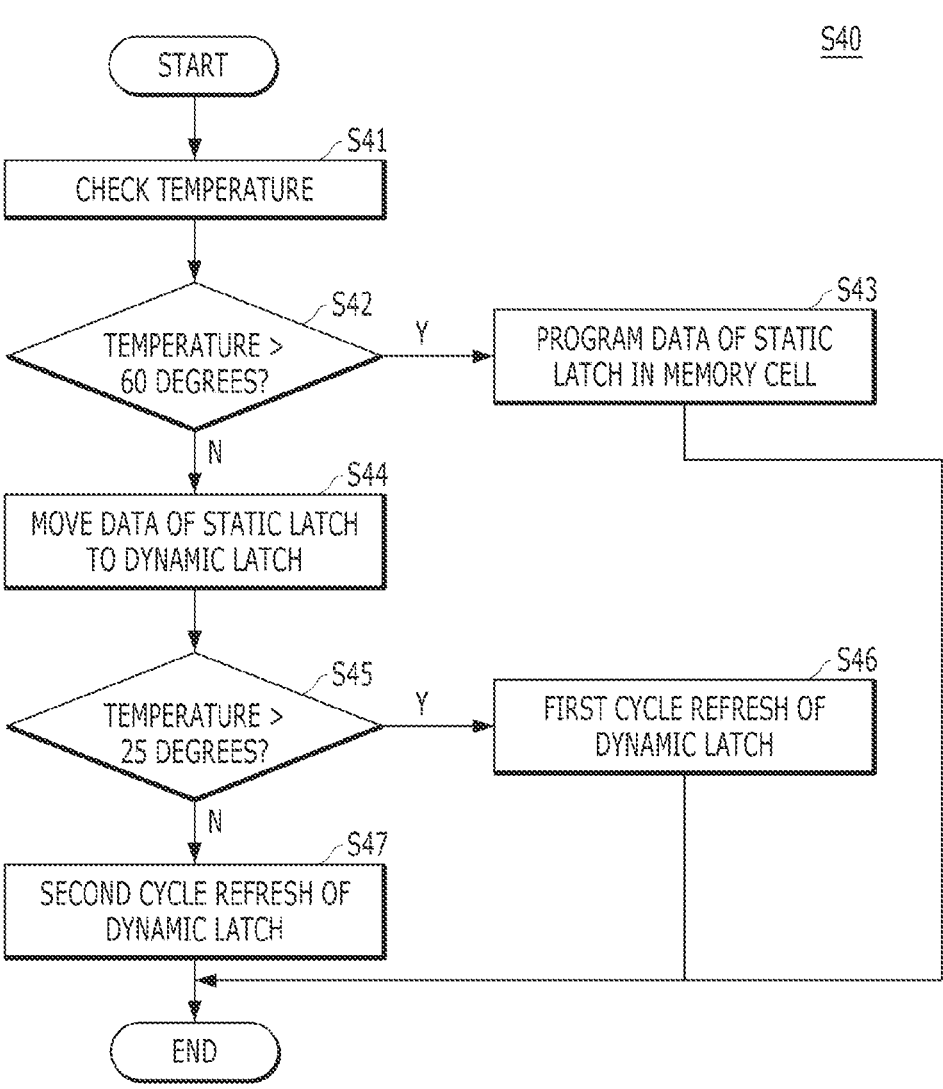

FIGS. 7 and 8 are flowcharts for describing operating methods of a semiconductor device according to embodiments of the present disclosure.

Referring to FIG. 7, an operating method of a semiconductor device according to an embodiment of the present disclosure may include a program operation step S10, a program completion determination step S20, a pause command reception check step S30, a latch data movement step S40, an another operation execution step S50, a resumption command reception check step S60, and a latch data return step S70.

The program operation step S10 may include a step of receiving a program command and providing a program pulse to a memory cell. In this case, the program target level of the memory cell may be adjusted based on data that are transmitted by the page buffer PB through the bit line BL.

The program completion determination step S20 may include a step of determining whether the voltage level of the threshold voltage of the memory cell on which a program operation is being performed is greater than the program target level.

When the voltage level of the threshold voltage of the memory cell on which the program operation is being performed is greater than the program target level, it may be determined that the program operation has been completed (Y), and the operating method of the semiconductor device according to an embodiment of the present disclosure may be terminated.

However, when the voltage level of the threshold voltage of the memory cell on which the program operation is being performed is not greater than the program target level in the program completion determination step S20, it may be determined that the program operation has not been completed (N), and a step of performing the pause command reception check step S30 may be performed.

The pause command reception check step S30 may include a step of checking whether a program pause command has been received in the state in which the program operation is being performed.

When it is checked that the program pause command has not been received (N) in the pause command reception check step S30, the program operation step S10 may be performed. Accordingly, in the operating method of the semiconductor device according to an embodiment of the present disclosure, when the reception of the program pause command is not checked in the pause command reception check step S30, the program operation step S10 of providing the program pulse to the memory cell until a program into the memory cell is completed may be repeatedly performed.

When it is checked that the program pause command has been received (Y) in the pause command reception check step S30, the latch data movement step S40 may be performed.

The latch data movement step S40 may include a step of moving data that have been stored in a plurality of latches included in the page buffer PB. In this case, the latch data movement step S40 may include a data movement step between static latches and a data movement step from a static latch to a dynamic latch. Furthermore, the latch data movement step S40 may additionally include a dynamic latch refresh operation step. For example, if the another operation execution step S50 includes performing a read operation, the latch data movement step S40 may include a data movement step between static latches, wherein data that have been stored in the first static latch 11 that senses data programmed into the memory cell MC are moved to one of other static latches 12, 13, and 14. In this case, the static latch in which the data of the first static latch 11 will be stored may be a latch that has transmitted the data to the memory cell MC, that is, a latch that has stored the programmed data. Furthermore, the latch data movement step S40 may include a step of moving the data of a static latch to a memory cell or a dynamic latch based on a temperature of the semiconductor device and a dynamic latch refresh operation step of refreshing a dynamic latch based on a temperature of the semiconductor device. In this case, the dynamic latch refresh operation step may be a step that is performed in the state in which data have been stored in the dynamic latch. Furthermore, the refresh cycle of a dynamic latch may be different based on a temperature of the semiconductor device.

The another operation execution step S50 may include a step of performing an operation other than a program operation in the state in which the program operation has paused without being completed. For example, the another operation execution step S50 may include a step of performing a read operation.

The resumption command reception check step S60 may include a step of checking whether a resumption command that instructs the paused program operation to be performed again has been received. For example, the resumption command reception check step S60 may include step of checking whether a command that instructs the paused program operation to be performed again because an operation of the another operation execution step S50 has been completed.

When the reception of the resumption command is not checked (N) in the resumption command reception check step S60, it may be determined that an operation being performed in the another operation execution step S50 has not been completed, and the another operation execution step S50 may be performed.

When the reception of the resumption command is checked (Y) in the resumption command reception check step S60, the latch data return step S70 may be performed.

The latch data return step S70 may include a step of storing the data that have been moved in the latch data movement step S40 in latches before the data had been moved. If the data of the first static latch 11 have been moved to the second static latch 12 in the latch data movement step S40, the latch data return step S70 may include a step of moving the data of the second static latch 12 to the first static latch 11. Furthermore, if the data of the first static latch 11 have been moved to the memory cell MC in the latch data movement step S40, the latch data return step S70 may include a step of moving the data of the memory cell MC to the first static latch 11. In this case, detailed descriptions of a data movement operation between a plurality of latches included in the page buffer PB and an operation of programming the data of the dynamic latch 21 into the memory cell may be substituted with the descriptions given with reference to FIGS. 3 to 6. When the latch data return step S70 is completed, the program operation S10 that has paused in response to the pause command may be resumed.

FIG. 8 is a flowchart for more specifically describing the latch data movement step S40 in FIG. 7.

Referring to FIG. 8, an operating method of the semiconductor device according to an embodiment of the present disclosure may include a temperature check step S41, a first selection step S42, a memory cell program step S43, a step S44 of moving data to a dynamic latch, a second selection step S45, a first cycle refresh step S46, and a second cycle refresh step S47.

The temperature check step S41 may include a step of checking a temperature of the semiconductor device.

The first selection step S42 may include a step of selecting the step S43 of moving the data of a static latch to a memory cell or the step S44 of moving the data of a static latch to a dynamic latch based on a temperature of the semiconductor device. For example, when it is determined that the temperature is a high temperature in the first selection step S42, the step S43 of programming the data of the static latch into the memory cell may be performed. When it is determined that the temperature is not a high temperature in the first selection step S42, the step S44 of moving the data of the static latch to the dynamic latch may be performed. More specifically, for example, when the temperature is higher than a reference temperature of 60 degrees in the first selection step S42, it may be determined that the temperature is a high temperature (Y), and the memory cell program step S43 may be performed. When the temperature is equal to or lower than the reference temperature of 60 degrees in the first selection step S42, it may be determined that the temperature is not a high temperature (N), and the step S44 of moving data to a dynamic latch may be performed.

The memory cell program step S43 may include a step of programming, into the memory cell MC, the data that have been stored in a static latch. For example, the memory cell program step S44 may include a step of transmitting, to the memory cell MC, data that have been stored in the first static latch 11.

The step S44 of moving data to a dynamic latch may include a step of storing, in a dynamic latch, data that have been stored in a static latch. In this case, the dynamic latch may maintain data that have been stored in the dynamic latch, through a refresh operation.

The second selection step S45 may be a step that is performed to maintain the data in the dynamic latch, and may include a step of selecting the refresh cycle of the dynamic latch based on a temperature of the semiconductor device.

When it is determined that the temperature is a middle temperature in the second selection step S45, that is, when it is determined that the temperature is higher than a reference temperature of 25 degrees (Y), the first cycle refresh step S46 of refreshing the dynamic latch 21 every first cycle may be performed.

When it is determined that the temperature is a low temperature in the second selection step S45, that is, when it is determined that the temperature is equal to or lower than the reference temperature of 25 degrees (N), the second cycle refresh step S47 of refreshing the dynamic latch 21 every second cycle may be performed.

The first cycle refresh step S46 may include a step of refreshing the dynamic latch 21 every first cycle shorter than the second cycle.

The second cycle refresh step S47 may include a step of refreshing the dynamic latch 21 every second cycle longer than the first cycle.

As a temperature of the semiconductor device becomes higher, a dynamic latch may require a refresh operation having a short cycle to maintain data that have been stored in the dynamic latch.

As described above, a semiconductor device according to an embodiment of the present disclosure can maintain the data of a static latch before a pause command is received, by storing the data of the static latch in a memory cell or a dynamic latch based on a temperature of the semiconductor device and performing a refresh operation on the dynamic latch, if data that have been stored in the page buffer needs to be maintained until a resumption command is received after the pause command is received in a program operation state. Accordingly, the program operation can be subsequently performed when the program operation that has paused is performed again in response to the reception of the resumption command.

Accordingly, a semiconductor device according to an embodiment of the present disclosure can improve the stability of a program operation because the program operation can be stably performed although the program operation is paused and then resumed to improve an area efficiency of the page buffer.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:
a memory cell connected to a word line and a bit line;
a line driving circuit configured to apply a program voltage to the word line;
a page buffer comprising a plurality of latches comprising at least one dynamic latch and at least one static latch and configured to control a voltage level of the bit line after a start of a program operation; and
a control circuit configured to control the page buffer to program, into the memory cell, data that have been stored in the static latch or store the data in the dynamic latch based on a temperature of the semiconductor device, when receiving a pause command during the program operation,
wherein the control circuit is configured to:
control the page buffer to program, into the memory cell, the data that have been stored in the static latch when the temperature is higher than a specific temperature, when receiving the pause command,
store, in the dynamic latch, the data that have been stored in the static latch when the temperature is equal to or lower than the specific temperature, and
control a refresh operation for the dynamic latch so that the data that have been stored in the dynamic latch are maintained.

2. The semiconductor device of claim 1, wherein the control circuit is configured to control the dynamic latch to perform the refresh operation having a long cycle as the temperature becomes lower when the temperature is equal to or lower than the specific temperature.

3. The semiconductor device of claim 1, wherein the control circuit is configured to control the page buffer to store, in the static latch, the data that have been programmed into the memory cell, when receiving a resumption command to instruct the program operation to be performed again.

4. An operating method of a semiconductor device, comprising:

determining whether a program operation has been completed;

checking whether a pause command is received in a state in which the program operation has not been completed;

controlling a page buffer so that data that have been stored in latches of the page buffer are moved, when receiving the pause command; and controlling the page buffer so that the moved data are returned when receiving a resumption command, wherein the latches of the page buffer comprise at least one dynamic latch and at least one static latch, and wherein, when a temperature is equal to or lower than a reference temperature, moving, to the dynamic latch, data that have been stored in the static latch, and controlling the dynamic latch to perform a refresh operation.

5. The operating method of claim 4, wherein controlling the page buffer so that the data are moved comprises programming, into a memory cell, data that have been stored in the static latch when a temperature of the semiconductor device is higher than a reference temperature.

6. The operating method of claim 5, wherein controlling the page buffer so that the moved data are returned comprises controlling the page buffer so that the data that have been programmed into the memory cell are stored in the static latch.

7. The operating method of claim 4, wherein controlling the dynamic latch to perform the refresh operation comprises controlling the dynamic latch to perform a refresh operation having a long cycle as the temperature becomes lower.

8. A page buffer comprising:

a switch circuit controlled to connect or disconnect a bit line and a common node in response to a page buffer selection signal; and at least one static latch and at least one dynamic latch connected to the common node and each configured to store data corresponding to a voltage level of the common node or form the voltage level of the common node as a voltage level corresponding to data that have been stored in the static latch and the dynamic latch in response to a latch control signal, wherein the data that have been stored in the static latch are programmed into a memory cell or moved to the dynamic latch through the bit line based on a temperature of a semiconductor device, wherein the dynamic latch is configured to perform a refresh operation having a long cycle as the temperature becomes lower when the temperature is equal to or lower than a reference temperature, under a control of a control circuit.

9. The page buffer of claim 8, wherein the static latch is configured to program the stored data into the memory cell when the temperature is higher than the reference temperature or move the stored data to the dynamic latch when the temperature is equal to or lower than the reference temperature, under the control of the control circuit.

* * * * *